United States Patent [19]
Hori et al.

[11] Patent Number: 5,950,112
[45] Date of Patent: Sep. 7, 1999

[54] SATELITE BROADCAST TUNER CAPABLE OF PROCESSING BOTH QPSK MODULATION SIGNAL AND FM SIGNAL

[75] Inventors: Makoto Hori, Yamatokooriyama; Kazuo Kitaura, Osaka, both of Japan

[73] Assignee: Sharp Kabushiki Kaisha, Osaka, Japan

[21] Appl. No.: 08/757,463

[22] Filed: Nov. 27, 1996

[30] Foreign Application Priority Data

Dec. 4, 1995 [JP] Japan ................................ 7-315153
Apr. 25, 1996 [JP] Japan ................................ 8-105419
Oct. 31, 1996 [JP] Japan ................................ 8-289855

[51] Int. Cl.$^6$ .................................................. H04N 5/46
[52] U.S. Cl. ........................................... 455/3.2; 348/725
[58] Field of Search ................................ 348/725, 554, 348/555, 705, 700; 364/919.3; 455/3.2, 142, 143; H09N 5/262, 5/46, 3/27

[56] References Cited

U.S. PATENT DOCUMENTS 5,463,675  10/1995  Hayashi et al. ...................... 348/725
5,666,170  9/1997  Stewart ................................ 348/726

Primary Examiner—Nathan Flynn

[57] ABSTRACT

There is provided a low-cost satellite broadcast tuner capable of receiving and processing both a QPSK modulation signal and an FM signal while assuring simple connection of an LNB (low noise block) to the tuner. A single front-end section including an RF stage, a mixer, a local oscillator circuit, an IF stage, an AGC loop is used for both an FM detector and an I/Q quadrature detector, so that both the FM signal and the QPSK modulation signal are received and processed in the single front-end section. In the above case, power supplied to the FM detector for detecting the FM signal, and power supplied to a local oscillator circuit required for detecting the QPSK modulation signal is turned off when receiving the FM signal.

12 Claims, 9 Drawing Sheets

SATELITE BROADCAST TUNER CAPABLE OF PROCESSING BOTH QPSK MODULATION SIGNAL AND FM SIGNAL

BACKGROUND OF THE INVENTION

The present invention relates to a satellite broadcast tuner, and in particular, to a satellite broadcast tuner which receives both an analog satellite broadcast (FM (frequency modulation)) and a digital satellite broadcast (QPSK (Quadrature Phase Shift Keying) modulation).

A prior art satellite broadcast tuner of this type will be described with reference to FIGS. 7 through 11. FIGS. 7 and 8 are schematic views of satellite broadcast receiving systems which receive both the conventional analog satellite broadcast (FM) and the digital satellite broadcast (QPSK modulation).

In the satellite broadcast receiving system shown in FIG. 7, a digital satellite broadcast receiver 203 and an analog satellite broadcast receiver 204 which are independent of each other are connected to independently provided parabola antennas 201 and 202, respectively. The digital satellite broadcast receiver 203 includes a digital satellite broadcast tuner 205, while the analog satellite broadcast receiver 204 includes an analog satellite broadcast tuner 206. The reference numerals 207 and 208 denote input terminals of the receivers 203 and 204, respectively.

Further, the parabola antennas 201 and 202 are each provided with an LNB (Low Noise Block down converter (not shown)) to be used for the digital satellite broadcast or the analog satellite broadcast.

When receiving a satellite broadcast with the above structure, RF (radio frequency) signals that have been down-converted to a 1-GHz band by the LNBs of the parabola antennas are independently inputted to the input terminals 207 and 208 of the receivers 203 and 204. Then, the digital satellite broadcast receiver 203 executes QPSK demodulation, while the analog satellite broadcast receiver 204 executes FM signal demodulation.

The satellite broadcast receiving system shown in FIG. 8 is an example in which a parabola antenna and an LNB are in common used for the digital satellite broadcast and the analog satellite broadcast. Components having the same functions as those of FIG. 7 are denoted by the same reference numerals. In the structure of FIG. 8, the digital satellite broadcast receiver 203 is connected to one parabola antenna 209 (provided with the LNB), and the digital satellite broadcast tuner 205 inside the digital satellite broadcast receiver 203 is further provided internally with an RF distributor 210. Then, the digital satellite broadcast receiver 203 and the analog satellite broadcast receiver 204 are connected with each other by connecting an RF output terminal 211 provided at the digital satellite broadcast receiver 203 to an input terminal 208 provided at the analog satellite broadcast receiver 204.

With the above arrangement, when receiving the digital satellite broadcast, the RF signal that has been down-converted into the 1-GHz band by the LNB mounted to the parabola antenna 209 is inputted from the input terminal 207 and then subjected to QPSK demodulation by the digital satellite broadcast receiver 203.

On the other hand, when receiving the analog satellite broadcast, the RF signal of the analog satellite broadcast that is similarly inputted to the input terminal 207 is distributed by the RF distributor 210 and then transmitted from the RF output terminal 211 to the input terminal 208 of the analog satellite broadcast receiver 204. Then, the FM signal is demodulated by the analog satellite broadcast receiver 204.

FIG. 9 shows a detailed structure of the analog satellite broadcast tuner 206. In FIG. 9 are shown a high-pass filter 222, a first RF amplifier 212, an attenuator 213, a second RF amplifier 214, a low-pass filter 215 and a down-converting first mixer 216. The reference numeral 217 denotes a first local oscillator circuit for supplying a local oscillation signal to the first mixer 216. The first mixer 216 outputs a first intermediate frequency signal having a frequency equal to a frequency difference between the RF signal and the local oscillation signal.

The reference numeral 218 denotes a PLL (phase-locked loop) circuit for locking the frequency of the local oscillator circuit 217 based on a channel data given from a microprocessor (not shown). The first intermediate frequency signal outputted from the first mixer 216 is amplified in an IF (intermediate frequency) amplifier 219, thereafter limited in bandwidth by a SAW (Surface Acoustic Wave) filter 220, and then transmitted to an IF·AGC (automatic gain control) amplifier 221. Then, the first intermediate frequency signal amplified in the IF·AGC amplifier 221 is frequency detected by a PLL type FM signal detector 231 to output a base band signal.

Further, an AGC circuit 230 is provided between the IF·AGC amplifier 221 and the attenuator 213. The AGC circuit 230 controls the attenuator 213 and the IF·AGC amplifier 221 according to the input level of the FM signal detector 231, the input level detected by an AGC detector 232.

It is to be noted that the reference numeral 223 denotes a low-pass filter, and the reference numeral 235 denotes a changeover switch for the SAW filter 220.

FIG. 10 shows a detailed structure of the above digital satellite broadcast tuner 205. Components having the same functions as those of FIG. 9 are denoted by the same reference numerals. In FIG. 10, the structure from the high-pass filter 222 to the IF·AGC amplifier 221 is approximately equal to that of the analog satellite broadcast tuner 206, and therefore, description is omitted therefor.

The reference numeral 400 denotes an I/Q quadrature detector which has two second mixers 401 and 402 for second down-converting use. It is to be noted that the reference numeral 216 denotes the first mixer for first down-converting use. The IF signal that has passed through the IF·AGC amplifier 221 is distributed into two paths to be inputted to the two second mixers 401 and 402 of the I/Q quadrature detector 400. The reference numeral 403 denotes a second local oscillator circuit which is a fixed-frequency local oscillator that oscillates at a frequency approximately equal to the intermediate frequency. Then, an output of the second local oscillator circuit 403 is distributed into two local signals having a mutual phase difference of 90° by a 90-deg. phase shifter 404. Thereafter, the resulting signals are inputted to the second mixers 401 and 402, where they are each mixed with the IF signal to be converted into base band signals.

The resulting I and Q signals that have been converted into the base band signals are amplified in base band amplifiers 224 and 225 and limited in bandwidth by Nyquist filters 226 and 227, and thereafter the resulting signals are outputted from an I-signal output terminal 228 and a Q-signal output terminal 229, respectively. Thereafter, the signals are inputted to a QPSK demodulation circuit in the subsequent stage.

FIG. 11 is a block diagram of the above QPSK demodulation circuit to be connected to the I/Q quadrature detector in the above digital satellite broadcast tuner.

The I/Q signal that has been obtained through the I/Q quadrature detection in the digital satellite broadcast tuner 205 is inputted to a QPSK demodulation circuit (video and audio processing circuit) 240 as shown in FIG. 11. Then, in this QPSK demodulation circuit 240, the I/Q signal is put through an error correcting section comprised of a QPSK demodulator 241, a Viterbi decoder 242 and a Reed-Solomon error correcting section 243, and thereafter the resulting signal is distributed into two paths to be transmitted to circuits in the subsequent stage. One of them is outputted as a video signal via an MPEG (Moving Picture (Coding) Experts Group) video decoder 244 and an NTSC (National Television System Committee) modulator 245. The other is outputted as an audio signal via an MPEG audio decoder 246 and an audio digital-to-analog converter 247.

Further, a control signal from the QPSK demodulator 241 is inputted to an input terminal 234 of the AGC circuit 230, and the AGC loop is controlled so that the I/Q signal at an appropriate level is inputted to the QPSK demodulation circuit 240.

It is to be noted that the reference numeral 248 denotes an M-COM (Microcomputer) and the reference numeral 249 denotes a DRAM (Dynamic Random Access Memory).

According to the satellite broadcast receiving system shown in FIG. 7, a total of two sets of the parabola antennas 201 and 202, LNBs and satellite broadcast receivers 203 and 204 are necessary for digital use and analog use.

On the other hand, according to the satellite broadcast receiving system shown in FIG. 8, only one set of the parabola antenna 209 and LNB is necessary, however, two sets of the satellite broadcast receivers 203 and 204 are still necessary.

In either case, wiring of the total system is complicated, and this disadvantageously leads to cost increase.

SUMMARY OF THE INVENTION

The object of the present invention is therefore to provide a low-cost satellite broadcast tuner capable of receiving and processing both a QPSK modulation signal and an FM signal while assuring simple connection of an LNB to the satellite broadcast tuner.

In order to achieve the aforementioned object, the present invention provides a satellite broadcast tuner comprising:

a single front-end section which converts an RF signal into an IF signal;

an FM detector which receives the IF signal from the front-end section and subjects the IF signal to FM detection;

a quadrature detector which receives the IF signal from the front-end section and subjects the IF signal to quadrature detection; and a QPSK demodulator which receives an I signal and a Q signal from the quadrature detector and subjects the signals to QPSK demodulation.

According to the above arrangement, the single front-end section for converting the RF signal into the IF signal is used for both the FM detector and the quadrature detector. Therefore, The front-end section for either one of the FM detector and the quadrature detector is omitted in comparison with the prior art satellite broadcast receiving system. Thus, both of the frequency-modulated RF signal and the QPSK-modulated RF signal can be received and detected by the satellite broadcast tuner that is more compact and less expensive than the prior art satellite broadcast tuner employing independent front-end sections for both the detectors.

Furthermore, an embodiment comprises a first AGC loop which includes an IF signal level detector for detecting a level of the IF signal and a first AGC circuit for controlling the level of the IF signal according to the detected level, and optimally controls an input level of the FM detector; and a second AGC loop which includes a second AGC circuit for controlling an input level of the quadrature detector according to a signal received from the QPSK demodulator, and optimally controls an input level of the QPSK demodulator.

According to the above arrangement, the level of the IF signal outputted from the single front-end section is controlled by the operation of the first AGC loop so that the input level of the FM detector is optimized. Furthermore, the input level of the quadrature detector is controlled by the operation of the second AGC loop so that the input level of the QPSK demodulator is optimized. Thus, the FM signal detection by the FM detector and the QPSK demodulation by the QPSK demodulator are correctly executed.

Furthermore, in an embodiment, the FM detector has a first oscillator circuit, the quadrature detector has a second oscillator circuit, and a changeover circuit which stops operation of the second oscillator circuit when detecting a frequency-modulated RF signal and stops operation of the first oscillator circuit when detecting a QPSK-modulated RF signal.

According to the above arrangement, the operation of the second oscillator circuit of the quadrature detector is stopped by the changeover circuit when the FM detector detects the FM signal, and the operation of the first oscillator circuit of the FM detector is stopped by the changeover circuit when the quadrature detector executes quadrature detection. Therefore, the first and second oscillator circuits are prevented from concurrently operating so as not to generate beat and affect the detection operation. In other words, the first and second oscillator circuits do not interfere with each other.

In an embodiment, the FM detector, the quadrature detector and the changeover circuit are formed on a one-chip semiconductor substrate.

According to the above arrangement, the FM detector and the quadrature detector are formed on the one-chip semiconductor substrate, and this leads to the compacting of the whole satellite broadcast tuner. Furthermore, in the above case, the first oscillator circuit of the FM detector and the second oscillator circuit of the quadrature detector are prevented from concurrently operating by the operation of the changeover circuit, so that the detection operation is not realized with mutual interference.

In an embodiment, the FM detector and the quadrature detector are housed in an identical chassis.

According to the above arrangement, the first oscillator circuit of the FM detector and the second oscillator circuit of the quadrature detector do not operate concurrently. Therefore, no interference occurs even if both the detectors are housed in an identical chassis. Thus, in view of the fact that the first and second oscillator circuits do not interfere with each other, both the detectors are housed in an identical chassis to achieve the simplification and compacting of a shield structure.

In an embodiment, the FM detector, the quadrature detector, the first AGC loop, the second AGC loop and the QPSK demodulator are housed in an identical chassis.

According to the above arrangement, the components of the satellite broadcast tuner is further reduced in number and the total structure is simplified.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail based on the illustrated preferred embodiments thereof.

Figure 1:
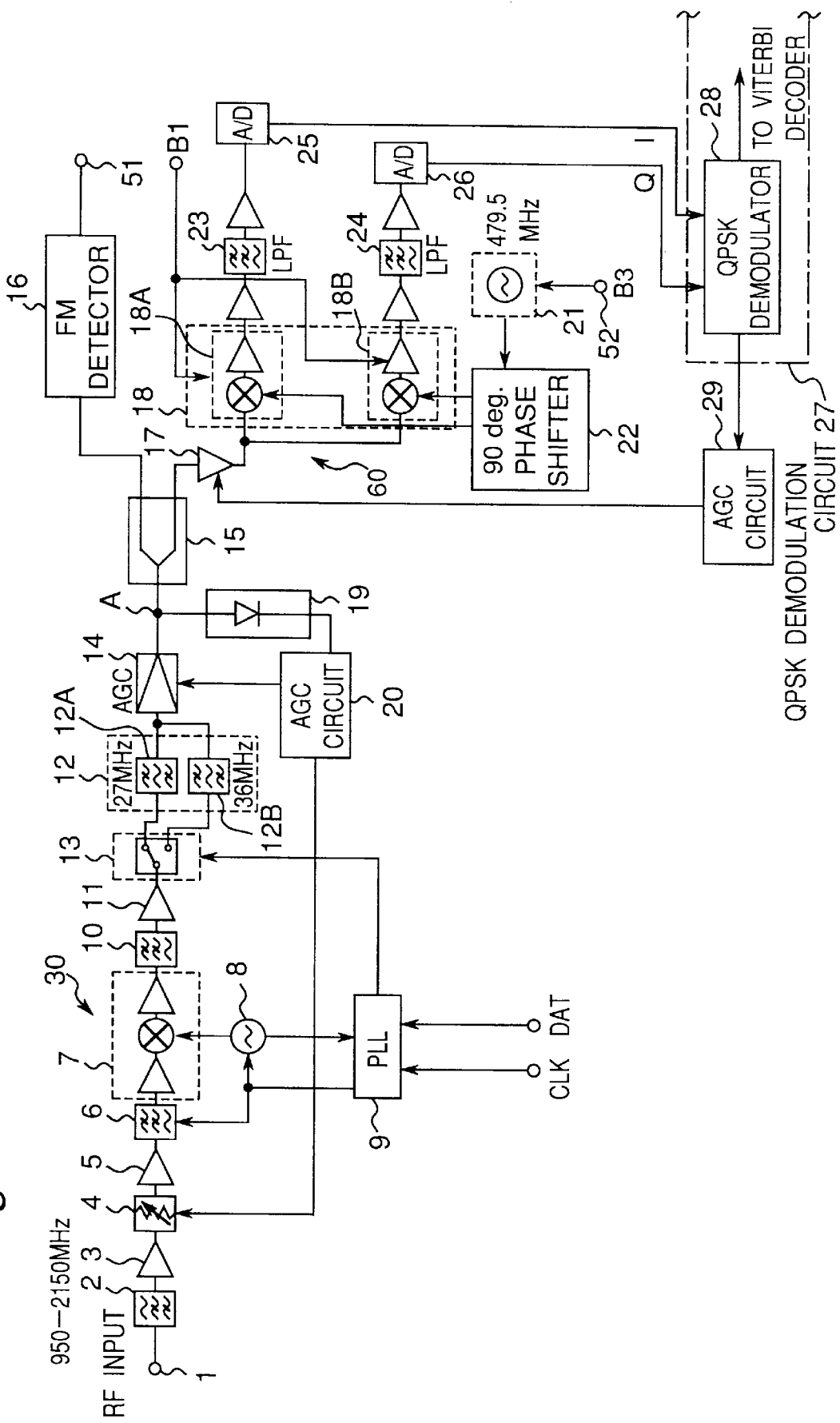
FIG. 1 is a block diagram of a satellite broadcast tuner according to a first embodiment of the present invention.

FIG. 1 is a block diagram of a satellite broadcast tuner according to the present embodiment.

In FIG. 1, a high-pass filter 2, an RF amplifier 3, an attenuator 4, an RF amplifier 5, a low-pass filter 6, a mixer 7, a local oscillator circuit 8, a PLL circuit 9, a low-pass filter 10, an IF amplifier 11, a SAW filter 12, an input changeover switch 13, an IF·AGC amplifier 14, an AGC detector 19 and an AGC circuit 20 are the circuits for converting the received RF signal into an IF signal, and they are collectively denoted as a front-end section 30.

A satellite broadcast RF signal is inputted from an input terminal 1 through the high-pass filter 2, RF amplifier 3, attenuator 4, RF amplifier 5 and low-pass filter 6 to the mixer 7 for first down-conversion, in which the RF signal is mixed with a local oscillation signal given separately from the local oscillator circuit 8.

The mixer 7 outputs a first intermediate frequency signal having a frequency equal to the frequency difference between the two signals of the RF signal and the local oscillation signal. The reference numeral 9 denotes a PLL circuit which locks the frequency of the local oscillation signal outputted from the local oscillator circuit 8 based on a channel data given from a microprocessor (not shown). After being put through the low-pass filter 10, the first intermediate frequency signal is amplified in the IF amplifier 11 and then limited in bandwidth by the SAW filter 12.

In this case, the SAW filter 12 is a dual-SAW filter comprised of a first SAW filter 12A having a bandwidth of 27 MHz and a second SAW filter 12B having a bandwidth of 36 MHz, in which one of them is selected by the input changeover switch 13 to be used. The SAW filter 12 is connected to the IF·AGC amplifier 14 and a distributor 15 in the subsequent stages.

It is to be noted that the dual-SAW filter 12 is used in the present embodiment, and this means it is required to change the bandwidth of the bandwidth limiting use IF-BPF between the case where the received signal is frequency-modulated for analog use and the case where the received signal is QPSK-modulated for digital use. If an identical bandwidth is permitted, it is proper to use a single SAW filter.

One flow of the IF signal bifurcated by the distributor 15 is inputted to the FM detector 16, while the other flow is inputted to an I/Q quadrature detection mixer 18 for second down conversion via an amplifier 17. In this case, the voltage level of the IF signal is maintained constant at the point A shown in FIG. 1 by a loop formed by the AGC detector (level detector) 19, AGC circuit 20, attenuator 4 and IF·AGC amplifier 14. Thus by maintaining the level at the point A constant so that the input level of the FM detector 16 comes to have an optimum level, correct FM detection is executed by the FM detector 16 when receiving an FM signal, so that an appropriate base band signal can be obtained. This feedback system is called the first AGC loop.

On the other hand, the signal inputted to the I/Q quadrature detection mixer 18 is converted into I and Q signals having a mutual phase difference of 90° as follows. That is, the I/Q quadrature detection mixer 18 has two mixers 18A and 18B. From the local oscillator circuit 21 to the mixers 18A and 18B are given oscillation signals which have an identical frequency and a phase difference of 90° formed by a 90 deg. phase shifter 22, so that the signals are supplied as carriers for the I signal and the Q signal.

The I and Q signals that have been thus converted into base band signals by the I/Q quadrature detection mixer 18 are outputted through low-pass filters 23 and 24. Then, the outputted I and Q signals are converted into digital signals in A/D (analog-to-digital) converters 25 and 26. Then, the signals are processed by a QPSK demodulation circuit 27 in the subsequent stage. An I/Q quadrature detector 60 is constituted by the I/Q quadrature detection mixer 18, local oscillator circuit 21 and 90 deg. phase shifter 22.

In the above structure, to the amplifier 17 provided in the stage previous to the I/Q quadrature detection mixer 18 is fed back the control signal outputted from an AGC circuit 29 based on an output from a QPSK demodulator 28 connected to the A/D converters 25 and 26 of the present satellite broadcast tuner, thereby executing control so that the I and Q signal output levels are optimized for the QPSK demodulation circuit 27. Thus, the system through which the feedback is effected from the QPSK demodulator 28 to the amplifier 17 is called the second AGC loop.

According to the above circuit constitution, in executing both the QPSK demodulation and FM signal demodulation, the single front-end section 30 that is comprised of the RF stage (high-pass filter 2, RF amplifier 3, attenuator 4, RF amplifier 5, low-pass filter 6), mixer 7, local oscillator circuit 8, PLL circuit 9, the IF stage (low-pass filter 10, IF amplifier 11, SAW filter 12), the first AGC loop (AGC detector 19, AGC circuit 20, IF·AGC amplifier 14, attenuator 4) and so forth and converts the RF signal into the IF signal is used in common for the I/Q quadrature detector 60 and the FM detector 16. With this arrangement, an inexpensive tuner capable of processing both the QPSK modulation signal (digital) and the FM signal (analog) can be provided.

Furthermore, in the above circuit structure, the front-end section 30 is used in common. Therefore, components can be reduced in number and both the circuits for QPSK demodulation and FM signal demodulation can be formed on a one-chip semiconductor substrate, thereby allowing the total structure to be remarkably compacted.

Since the PLL system is mainly used currently for the FM detector 16, an oscillator circuit (not shown) having a frequency approximately equal to the IF (intermediate frequency) is used. Furthermore, the oscillator circuit 21 having a frequency approximately equal to the intermediate frequency also exists in the I/Q quadrature detector 60. Therefore, in the satellite broadcast tuner shown in FIG. 1, when a terminal 52 of a power supplied to the local oscillator circuit 21 for use in the I/Q quadrature detector 60 and a terminal 51 of a power supplied to the FM detector 16 are always put in their on-states, beat is generated between the oscillator circuits to affect the detection operations. Therefore, in order to prevent both the oscillator circuits from interfering with each other, it is required to electrically separate the FM detector 16 from the I/Q quadrature detector 60 by providing a sufficient shield on both of them.

Therefore, according to the present embodiment, the power terminals 51 and 52 are turned on and off depending on whether the digital satellite broadcast or the analog satellite broadcast is selected, so that the possible occurrence of interference between both the oscillator circuits is surely eliminated.

The system of turning on and off the power terminals 51 and 52 will be described below with reference to FIG. 2.

That is, transistors 61 and 62 are turned off by turning off a switch S1 when receiving a digital signal, and consequently no voltage is applied to the power terminal 51 for the analog broadcast use. On the other hand, a transistor 63 is turned on to apply a voltage to the power terminal 52 for the digital broadcast use. By turning on the switch S1 when receiving the analog broadcast, the transistors 61 and 62 are turned on, while the transistor 63 is turned off. Consequently, the voltage is applied to the power terminal 51 for the analog broadcast use, while no voltage is applied to the power terminal 52 for the digital broadcast use.

Figure 2:
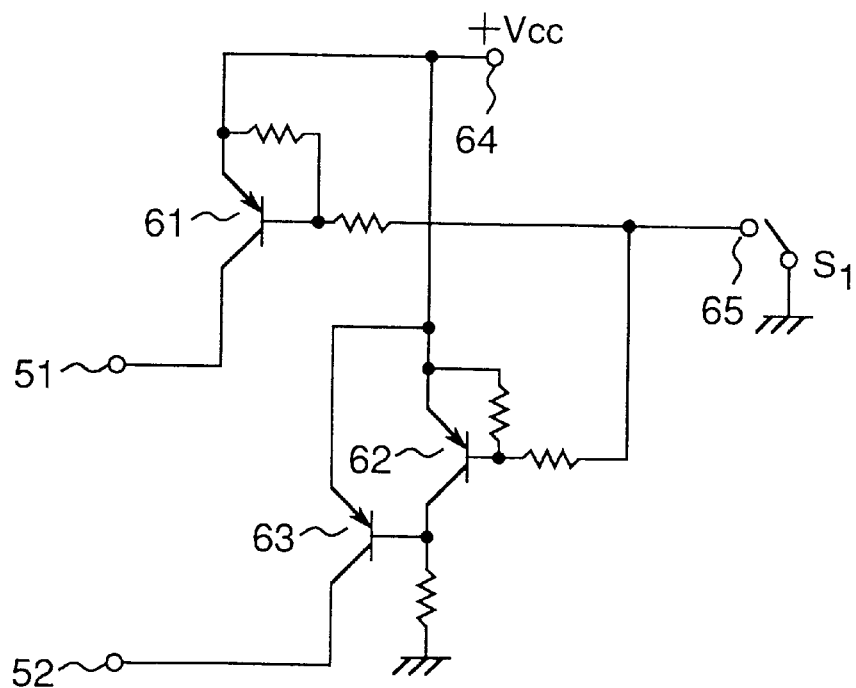
FIG. 2 is a schematic diagram of a changeover circuit for changing over between ON and OFF states of both the oscillator circuits of the FM detector and the I/Q quadrature detector shown in FIG. 1.
Figure 3:
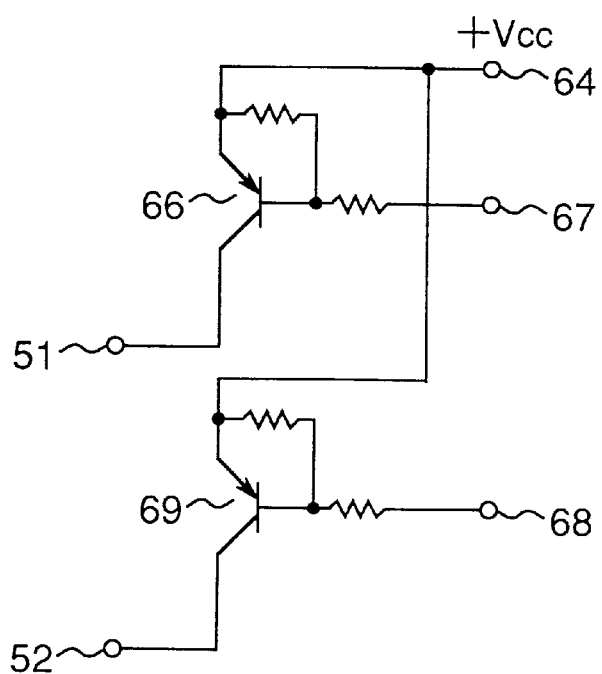
FIG. 3 is a schematic diagram of a changeover circuit different from the one shown in FIG. 2.

The turning-on/off control of a switch terminal 65 may be executed by the switch S1 externally of the satellite broadcast tuner as shown in FIG. 2, however, it is acceptable to execute the control by means of an I/O port of an IC (Integrated Circuit) constituting the PLL circuit 9 provided inside the satellite broadcast tuner. When the I/O port of the IC is used, control terminals 67 and 68 are provided as shown in FIG. 3, and the I/O port is connected to the control terminals 67 and 68 to execute the control.

In the present case, the polarities of the control terminals 67 and 68 must be inverse to each other. When the control terminal 67 is on and the control terminal 68 is off, a transistor 66 is turned off and a transistor 69 is turned on, so that the voltage is applied to the power terminal 52 for the digital broadcast use. In contrast to the above, when the control terminal 68 is on and the control terminal 67 is off, the on/off states of the transistors 66 and 69 are inverted, so that the voltage is applied to the power terminal 51 for the analog broadcast use.

It is to be noted that data for controlling the H/L statuses of the two I/O ports are transmitted together with a selection data from the microprocessor to the PLL circuit 9.

Figure 4:
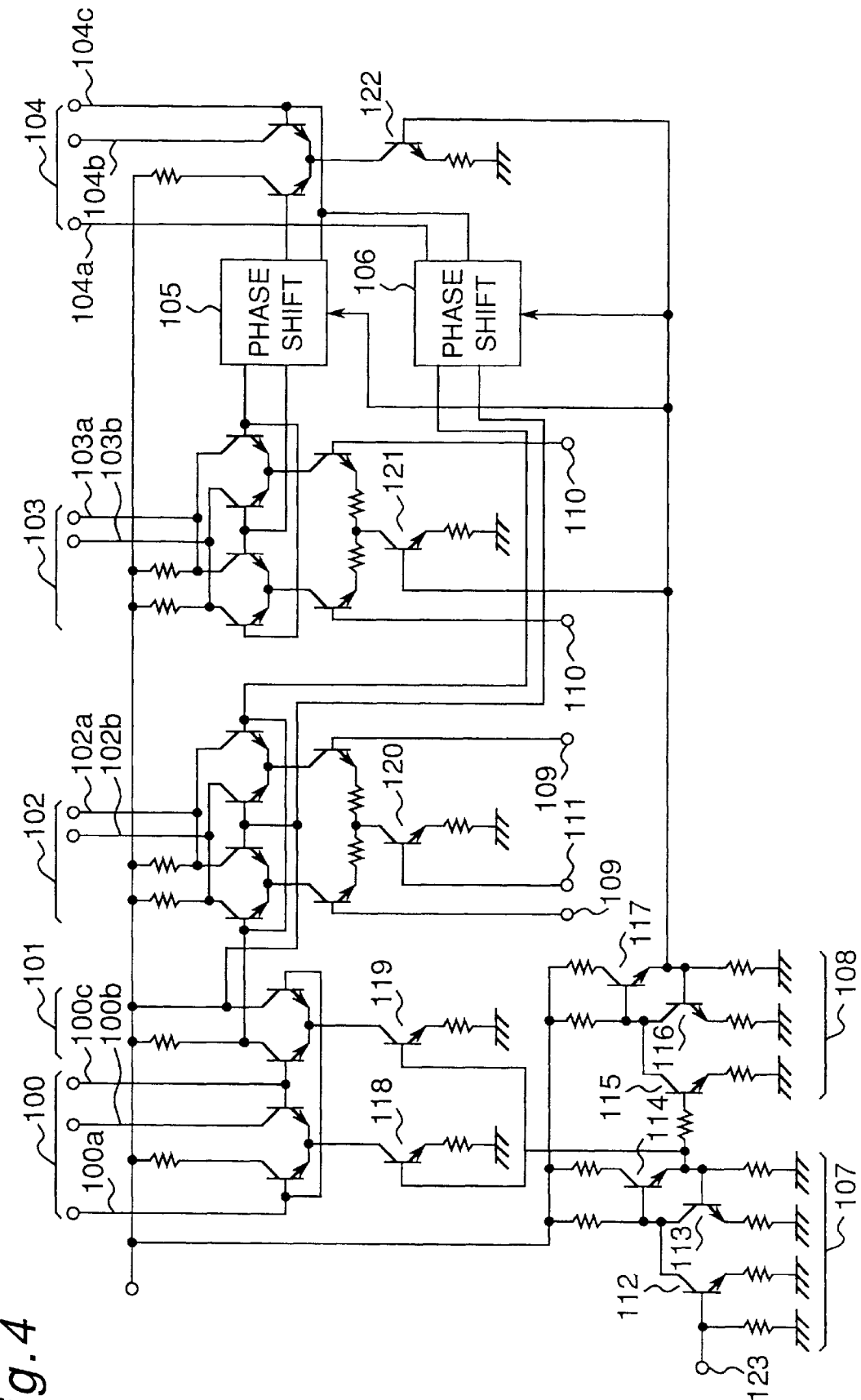
FIG. 4 is a circuit diagram showing a structural example of a detection section shown in FIG. 1.

Furthermore, there has been promoted use of ICs in satellite broadcast tuners, so that the FM signal detection section and the IQ detection section are provided by ICs. Therefore, it can be considered to provide the FM signal detection section and the I/Q quadrature detection section by one chip in a satellite broadcast tuner capable of receiving both the analog and digital satellite broadcasts. In this case, double-balance type mixers 102 and 103 as shown in FIG. 4 are used as mixer circuits in the FM signal detection section and the I/Q quadrature detection section.

In such a satellite broadcast tuner, the same mixers 102 and 103 are provided for the FM signal detection and the I/Q quadrature detection, and an oscillator circuit 100 and an oscillator circuit 104 for the respective mixers 102 and 103 are driven by switching the FM signal detection and the I/Q quadrature detection. The switching operation will be described.

When executing the QPSK demodulation, the signal amplified in the IF·AGC amplifier 14 shown in FIG. 1 is inputted to input terminals 109 and 110 of the mixers 102 and 103. When executing the FM signal detection, the signal amplified in the IF·AGC amplifier 14 is inputted to the input terminal 109 of the mixer 102. A local oscillation signal obtained in the oscillator circuit 100 is outputted from output terminals 102a and 102b.

The operations of the changeover circuits 107 and 108 of the current sources will be described herein. When a voltage of level "H" is applied to a digital/analog changeover terminal 123, a transistor 112 is turned on, and a current source comprised of transistors 113 and 114 becomes unoperated, so that transistors 118 and 119 connected to the current source do not operate.

In this case, a transistor 115 is turned off and a current source comprised of transistors 116 and 117 operates. In this stage, transistors 121 and 122 that are connected to the transistors 116 and 117 in a current-mirror form and phase shifters 105 and 106 operate. On the other hand, as described above, the transistors 118 and 119 do not operate. Further, it is assumed that the transistor 120 is connected to another current source to be always operated. With the above arrangement, the oscillator circuit 100 necessary for the FM signal detection does not operate.

As described above, by turning on and off the power terminals 51 and 52 of the FM detector 16 and the I/Q quadrature detector 60, the possible occurrence of mutual interference between both the oscillator circuits can be prevented. As a result, the above arrangement can contribute to the simplification of the shield of the oscillator circuits. Therefore, according to the first embodiment, the FM detector 16 and the I/Q quadrature detector 60 can be housed in an identical chassis, so that no problem occurs due to the mutual interference even when compacting and reduction in number of components are achieved.

Figure 5:
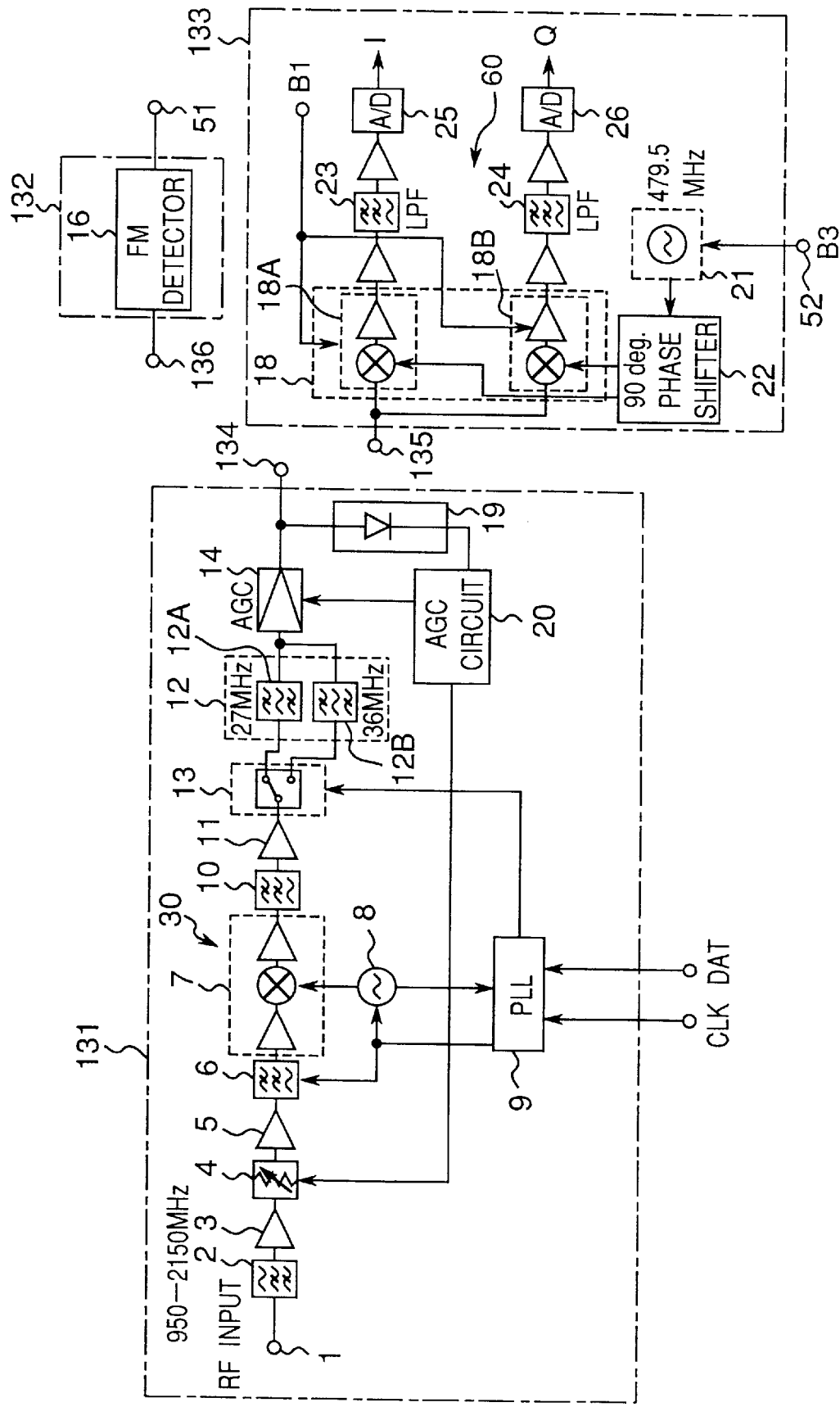
FIG. 5 is a block diagram of a satellite broadcast tuner according to a second embodiment of the present invention.

Next, FIG. 5 shows a second embodiment. The same structure as that of the first embodiment shown in FIG. 1 are denoted by the same reference numerals, and no description is provided therefor.

In this second embodiment, a satellite broadcast tuner is divided into an RF-IF block 131, a FM signal detection block 132 and an IQ detection block 133, so that the possible occurrence of mutual interference between the blocks is eliminated. Operations of the blocks are as described above. It is to be noted that the RF-IF block 131 itself has a closed circuit constitution. Then, the first intermediate frequency signal is outputted from a terminal 134, and the outputted first intermediate frequency signal is inputted from a terminal 135 to the IQ detection block 133 and inputted from a terminal 136 to the FM signal detection block 132.

Figure 11:
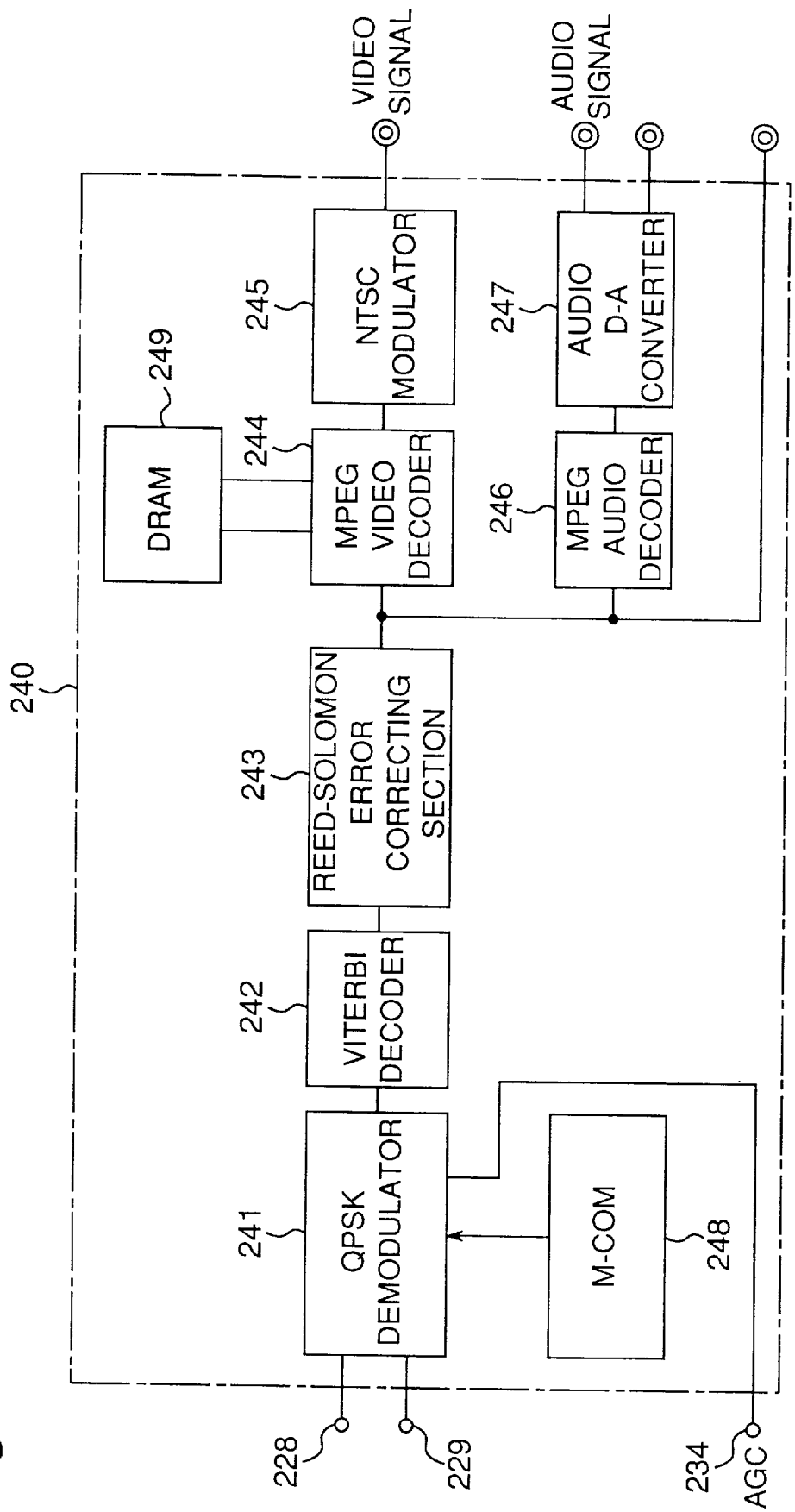
FIG. 11 is a circuit diagram of a QPSK demodulation circuit connected to the subsequent stage of the satellite broadcast tuner shown in FIG. 10.

The first intermediate frequency signal inputted to the terminals 135 and 136 is detected in the blocks 132 and 133. In this case, the FM signal detection block 132 may include video and audio processing. Furthermore, the IQ detection block 133 may be provided as one unit including a QPSK demodulator and a Viterbi decoder as shown in FIG. 11 or including the QPSK demodulator through the Reed-Solomon error correcting section. Furthermore, a structure for turning off the operation of the oscillator circuit may be incorporated as in the first embodiment.

Furthermore, so as to include not only the first AGC loop but also the second AGC loop, the structure covering the input terminal 1 through the QPSK demodulation circuit as shown in FIG. 11 may be enclosed in one package. If such an arrangement is adopted, there is no need to put the control signal and so forth out of the tuner, thereby allowing a compact satellite broadcast tuner having a reduced number of components to be achieved.

Figure 6:
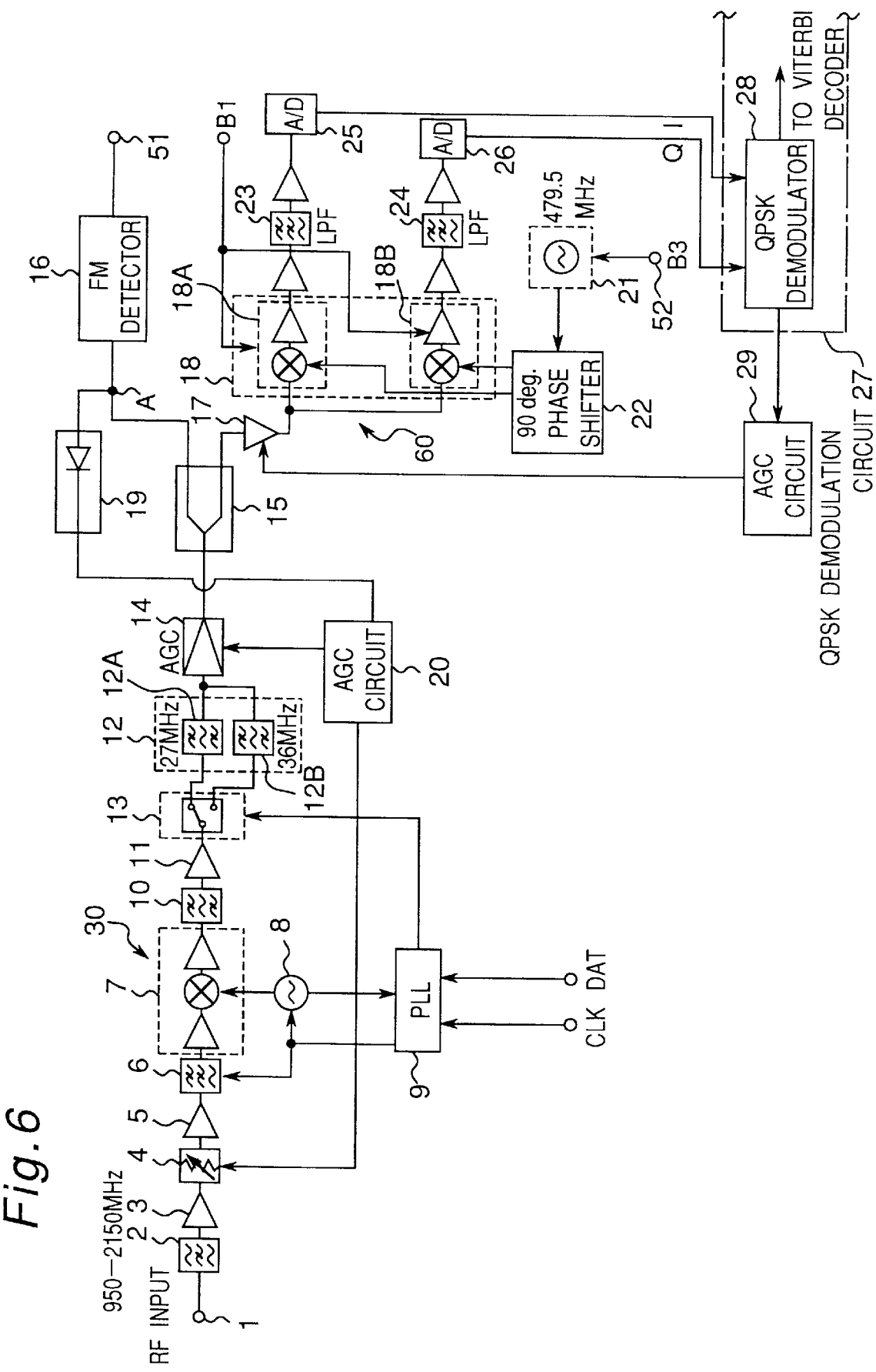
FIG. 6 is a block diagram in which a level detection position of an AGC detector shown in FIG. 1 is relocated to another position.
Figure 7:
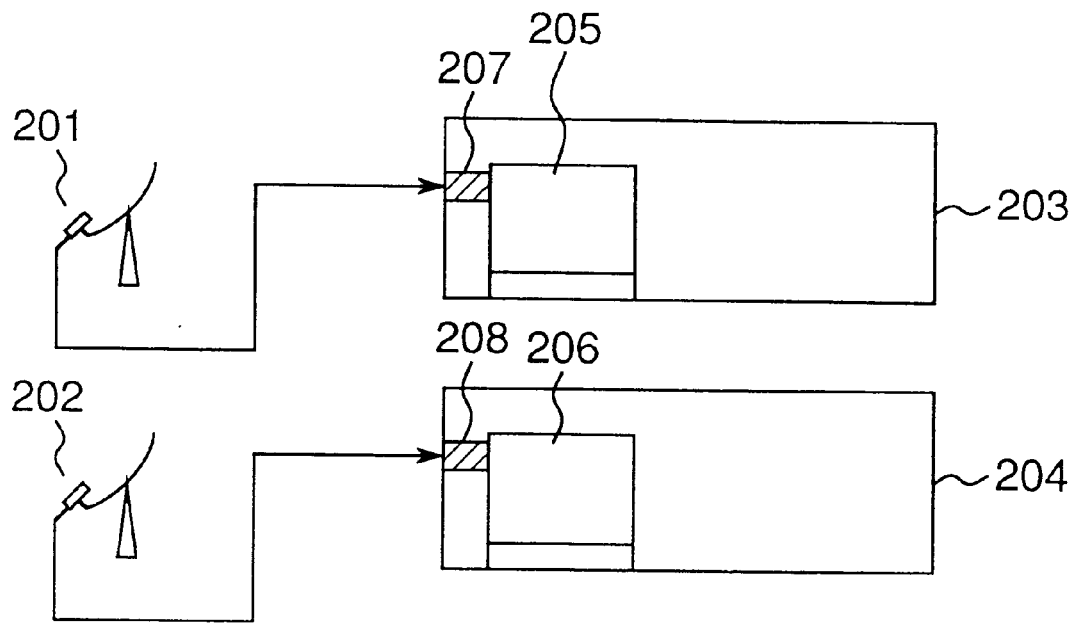
FIG. 7 is a schematic diagram of a satellite broadcast receiving system of a prior art.
Figure 8:
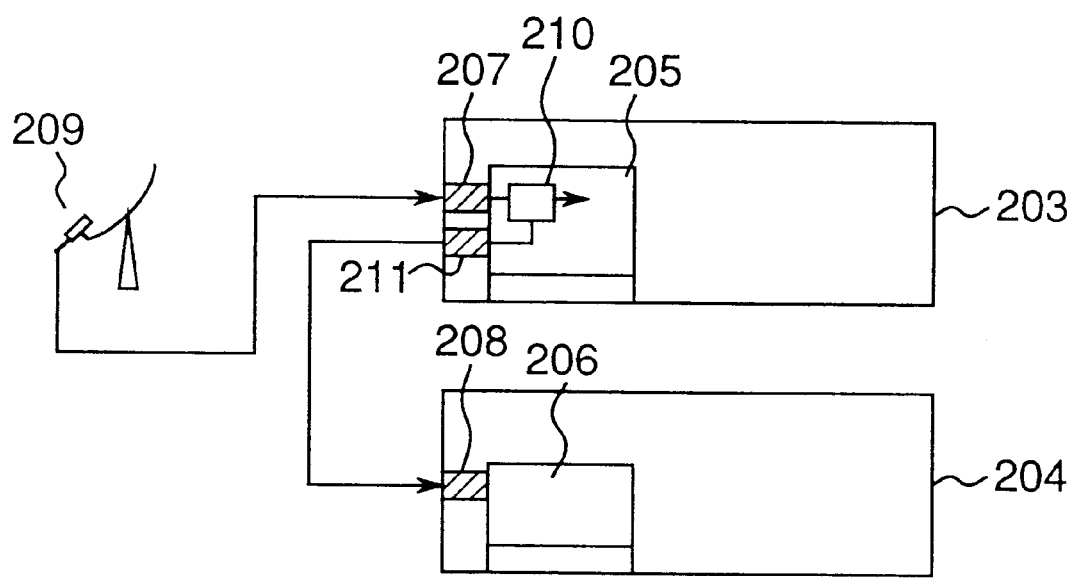
FIG. 8 is a schematic diagram of a satellite broadcast receiving system of a prior art different from the one shown in FIG. 7.
Figure 9:
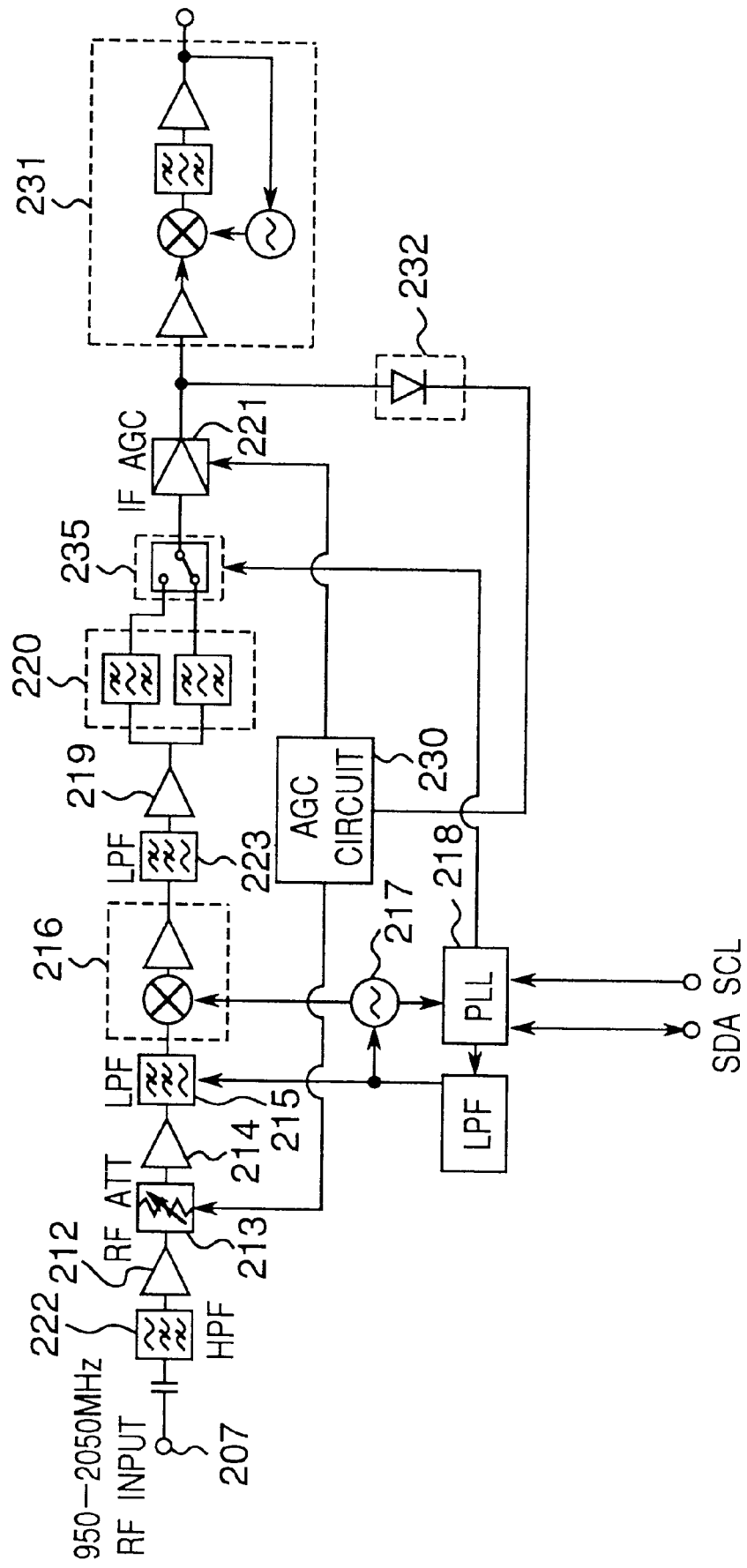
FIG. 9 is a block diagram of an analog satellite broadcast tuner of a prior art.
Figure 10:
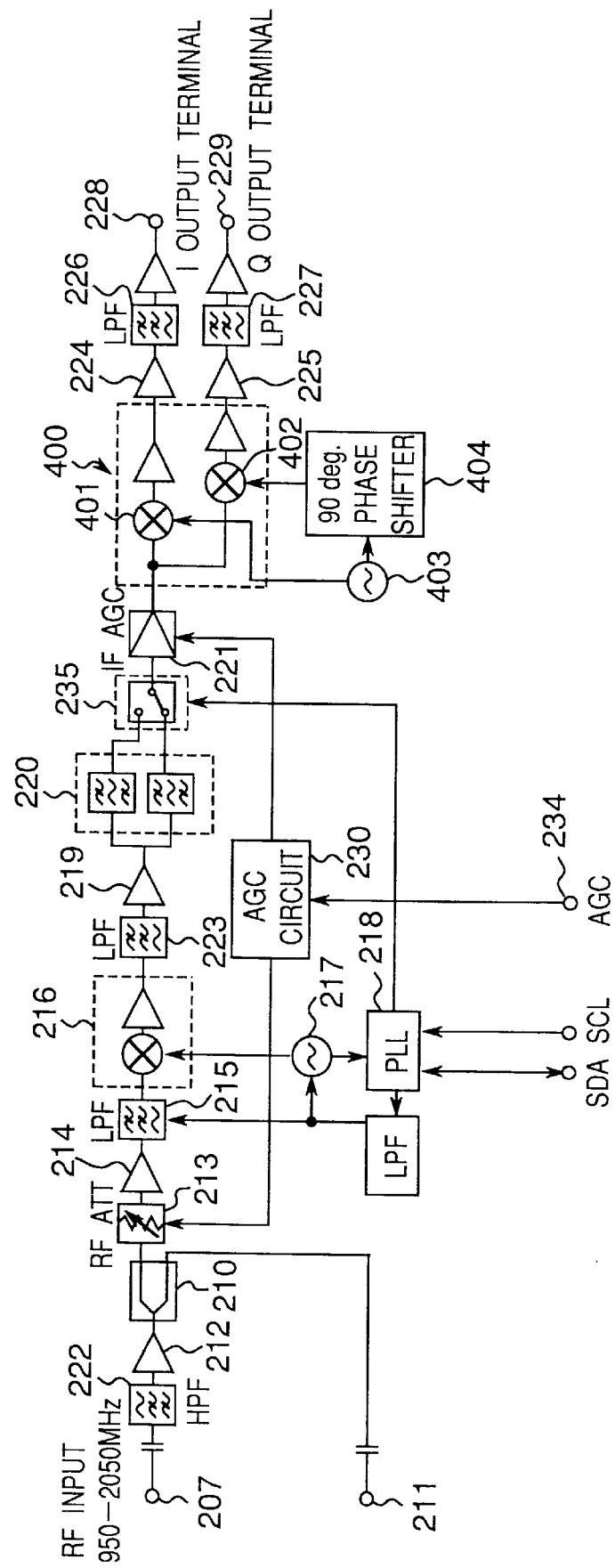
FIG. 10 is a block diagram of a digital satellite broadcast tuner of a prior art.

In each of the aforementioned embodiments, the output level of the IF·AGC amplifier 14 is detected by the AGC detector 19 and then transmitted to the AGC circuit 20. However, in the present invention, as shown in FIG. 6, the level of the IF signal that is distributed by the distributor 15 and inputted to the FM detector 16 may be detected by the AGC detector 19 and transmitted to the AGC circuit 20.

It is to be noted in this case that the possible occurrence of level reduction by the distributor 15 must be taken into consideration in controlling the attenuator 4 and the IF·AGC amplifier 14 by the AGC circuit 20.

As apparent from the above description, the satellite broadcast tuner of the present invention uses the single front-end section for converting the RF signal into the IF signal in common for the FM detector and the quadrature detector. Therefore, an inexpensive satellite broadcast tuner capable of receiving and demodulating both the frequency-modulated RF signal (analog satellite broadcast) and the QPSK-modulated RF signal (analog satellite broadcast) in the single front-end section can be provided. Furthermore, connection of the LNB to the satellite broadcast tuner can be easily achieved.

Furthermore, the satellite broadcast tuner of an embodiment comprises: a first AGC loop for optimally setting the input level of the FM detector by the first AGC circuit according to the level of the IF signal detected by the IF signal detector; and a second AGC loop for optimally setting the input level of the QPSK demodulator by the second AGC circuit according to the signal from the QPSK demodulator provided in the stage subsequent to the quadrature detector. Therefore, the FM signal detection by the FM detector and the QPSK demodulation by the QPSK demodulator can be correctly executed.

Furthermore, in the satellite broadcast tuner of an embodiment, the FM detector has the first oscillator circuit, while the quadrature detector has the second oscillator circuit. Then, the operation of the second oscillator circuit is stopped when detecting the frequency-modulated RF signal, and the operation of the first oscillator circuit is stopped when detecting the QPSK-modulated RF signal by the changeover circuit. Therefore, the first and second oscillator circuits can be prevented from concurrently operating so as not to generate beat and affect the detection operation.

In other words, according to the present embodiment, the first and second oscillator circuits do not interfere with each other.

Furthermore, in the satellite broadcast tuner of an embodiment, the FM detector, the quadrature detector and the changeover circuit are formed on a one-chip semiconductor substrate. Therefore, the whole satellite broadcast tuner can be compacted. Furthermore, in such a case, the first oscillator circuit of the FM detector and the second oscillator circuit of the quadrature detector can be prevented from operating concurrently, so that the detection operation can be prevented from being affected by the mutual interference.

Furthermore, in the satellite broadcast tuner of an embodiment, the FM detector and the quadrature detector of which oscillator circuits do not concurrently operate are housed in an identical chassis. Therefore, the shield structure can be simplified to allow the compacting to be achieved.

Furthermore, in the satellite broadcast tuner of an embodiment, the FM detector, the quadrature detector, the first AGC loop, the second AGC loop and the QPSK demodulator are housed in an identical chassis. Therefore, the components can be further reduced in number and the total structure can be simplified.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A satellite broadcast tuner comprising:
    a single front-end section which converts an RF signal into an IF signal;
    an FM detector that has a first oscillator circuit and receives the IF signal from the front-end section and subjects the IF signal to FM detection;
    a quadrature detector that has a second oscillator circuit and receives the IF signal from the front-end section and subjects the IF signal to quadrature detection;
    a QPSK demodulator that receives an I signal and a Q signal from the quadrature detector and subjects the signals to QPSK demodulation; and
    a changeover circuit that stops operation of the second oscillator circuit when detecting a frequency-modulated RF signal and stops operation of the first oscillator circuit when detecting a QPSK-modulated RF signal.

2. A satellite broadcast tuner as claimed in claim 1, further comprising:
    a first AGC loop which includes an IF signal level detecting means for detecting a level of the IF signal and a first AGC circuit for controlling the level of the IF signal according to the detected level, and optimally controls an input level of the FM detector; and
    a second AGC loop which includes a second AGC circuit for controlling an input level of the quadrature detector according to a signal received from the QPSK demodulator, and optimally controls an input level of the QPSK demodulator.

3. A satellite broadcast tuner as claimed in claim 1, wherein the FM detector, the quadrature detector and the changeover circuit are formed on a one-chip semiconductor substrate.

4. A satellite broadcast tuner as claimed in claim 1, wherein
the FM detector and the quadrature detector are housed in an identical chassis.

5. A satellite broadcast tuner as claimed in claim 2, wherein
the FM detector, the quadrature detector, the first AGC loop, the second AGC loop and the QPSK demodulator are housed in an identical chassis.

6. A satellite broadcast tuner comprising:
a single front-end section which converts an RF signal into an IF signal;
an FM detector which receives the IF signal from the front-end section and subjects the IF signal to FM detection;
a quadrature detector which receives the IF signal from the front-end section and subjects the IF signal to quadrature detection;
a QPSK demodulator which receives an I signal and a Q signal from the quadrature detector and subjects the signals to QPSK demodulation;
a first AGC loop which includes an IF signal level detecting means for detecting a level of the IF signal and a first AGC circuit for controlling the level of the IF signal according to the detected level, and optimally controls an input level of the FM detector; and
a second AGC loop which includes a second AGC circuit for controlling an input level of the quadrature detector according to a signal received from the QPSK demodulator, and optimally controls an input level of the QPSK demodulator.

7. A method for receiving both an analog and digital satellite broadcasts with a satellite broadcast tuner, comprising the steps of:
converting an RF signal into an IF signal with a front-end section of the tuner;
receiving the IF signal from the front-end section and subjecting the IF signal to FM detection with an FM detector of the tuner;
receiving the IF signal from the front-end section and subjecting the IF signal to quadrature detection with a quadrature detector of the tuner;
receiving an I signal and a Q signal from the quadrature detector and subjecting the signals to QPSK demodulation;

stopping operation of a first oscillator circuit within the FM detector when detecting a QPSK-modulated RF signal; and
stopping operation of a second oscillator circuit within the quadrature detector when detecting a frequency-modulated RF signal.

8. A method for receiving both an analog and a digital satellite broadcast with a satellite broadcast tuner, comprising the steps of:
converting an RF signal into an IF signal with a front-end section of the tuner;
receiving the IF signal from the front-end section and subjecting the IF signal to FM detection with an FM detector of the tuner;
receiving the IF signal from the front-end section and subjecting the IF signal to quadrature detection with a quadrature detector of the tuner;
receiving an I signal and a Q signal from the quadrature detector and subjecting the signals to QPSK demodulation;
detecting a level of the IF signal;
controlling the level of the IF signal according to the detected level;
optimally controlling an input level of the FM detector;
controlling an input level of the quadrature detector according to a signal received from the QPSK demodulator; and
optimally controlling an input level of the QPSK demodulator.

9. A method as claimed in claim 7, further comprising:
executing the stopping operations with a changeover circuit; and
forming the FM detector, the quadrature detector and the changeover circuit on a one-chip semiconductor substrate.

10. A satellite broadcast tuner as claimed in claim 7, further comprising housing the FM detector and the quadrature detector in an identical chassis.

11. A method as claimed in claim 8, further comprising:
stopping operation of a first oscillator circuit within the FM detector when detecting a QPSK-modulated RF signal; and
stopping operation of a second oscillator circuit within the quadrature detector when detecting a frequency-modulated RF signal.

12. A satellite broadcast tuner as claimed in claim 11, wherein all of the steps of claim 11 are executed with circuitry housed in an identical chassis.

* * * * *